United States Patent
Artman et al.

(10) Patent No.: US 6,874,566 B1
(45) Date of Patent: Apr. 5, 2005

(54) HEAT SINK WITH INTERMEDIATE FAN ELEMENT

(75) Inventors: Paul T. Artman, Austin, TX (US); Eric C. Wobig, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 10/666,390

(22) Filed: Sep. 19, 2003

(51) Int. Cl.[7] ............................................... H05K 7/20
(52) U.S. Cl. ....................... 165/80.3; 165/120; 361/697
(58) Field of Search ................................ 165/80.3, 121, 165/122, 185; 361/697

(56) References Cited

U.S. PATENT DOCUMENTS

| | | | |
|---|---|---|---|
| 5,638,895 A | 6/1997 | Dodson | 165/121 |
| 5,787,971 A | 8/1998 | Dodson | 161/121 |
| 6,449,151 B1 | 9/2002 | Chen | 361/697 |
| 6,449,152 B1 | 9/2002 | Lin | 361/697 |
| 6,625,021 B1 | 9/2003 | Lofland et al. | 361/697 |

*Primary Examiner*—Allen J. Flanigan
(74) *Attorney, Agent, or Firm*—Baker Botts L.L.P.

(57) ABSTRACT

An active heat sink is disclosed that includes a fan elements between two sets of fins. When activated the fan forces air through the fins in a transverse direction across the length of the fins. Because the blades of the fan are bracketed on both sides by the fins of the heat sink, a fan guard is not necessary or installed over the blades of the fan.

11 Claims, 3 Drawing Sheets

HEAT SINK WITH INTERMEDIATE FAN ELEMENT

TECHNICAL FIELD

The present disclosure relates generally to the field of computer or information systems, and, more particularly, to heat sink with an associated fin element.

BACKGROUND

As the value and use of information continues to increase, individuals and businesses continually seek additional ways to process and store information. One option available to users of information is an information handling system. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process store, and communicate information and may include one or more computer systems, data storage systems, and networking systems.

Information handling systems, including computer systems, typically include at least one microprocessor, memory, and various input and output devices. The power consumed by a microprocessor typically generates heat in the interior of the computer system. As computer systems grow in speed and shrink in size, issues of heat dissipation and component spacing in the interior of the computer system become more important. The heat generated by a microprocessor is especially problematic in multiple processor systems, including many server systems, in which multiple processors are located on a single motherboard. Because most microprocessors do not have a physical structure to remove the heat generated by the microprocessor, many computer systems include a heat sink that is placed near the microprocessor to dissipate the heat generated by the microprocessor. Heat sinks are used to draw heat away from the microprocessor and the motherboard.

To increase the performance and reliability of heat sinks, some manufacturers of computers systems have begun using active heat sinks, which are characterized by the placement of a fan on top of or on the side of heat sink to aid in the convective heat transfer across the heat sink. An active heat sink aids the cooling of the processor in that it eliminates the dependency of the processor on the system fan or fans for the circulation of air in the interior of the computer system. The placement of a rotating fan in a computer system, however, raises safety issues related to the ability of a user to injure himself or herself by accidentally placing a finger or foreign object in the fan. Although a fan guard may help prevent an object from being placed in the fan, the placement of a fan guard around the fan reduces the air flow through the fan and can produce an undesirable audible noise.

Many heat sinks include a design that includes a base with a number of parallel fins coupled to the base. Depending on the distance between adjacent fins, the length of the fins, and the speed and direction of forced air flow through the fins, a boundary layer may be established between adjacent fins, limiting the heat transfer between the fins and the air between the fins. Heat sinks having more closely spaced fins or lengthy fins are more likely to generate a boundary layer between adjacent fins that limits the degree of heat transfer. In addition, lengthy and closely spaced fins tend to limit the air turbulence or swirling of air between adjacent fins, thereby limiting the heat dissipation of the forced air through the fins.

SUMMARY

In accordance with the present disclosure, an active heat sink is disclosed in which a fan or other wind dispersing element is placed between two sets of fins of a heat sink.

One technical advantage of the present disclosure is that the design of the active heat sink of the present disclosure eliminates the need for a fan guard. Because of the placement of heat sinks fins on opposite sides of the openings of the fan, the blades of the fan are bracketed by the fins of the heat sink, and the user is not able to put his or her finger or a foreign object into the blades of the fan. The elimination of a fan guard in the present design also eliminates in fan guard noise and the associated cost of a fan guard In addition, the lack of a fan guard will aid in the cooling efficiency of the fan, as the flow of air between the fins of the heat sinks and the blades of the fan will not be impeded by a fan guard.

Another technical advantage of the active heat sink disclosed herein is that the flow of air through the active heat sink is in the transverse direction, which is in a direction across the length of the heat sink. The forced air is directed out off the active heat sink in a known or predicted direction. The design of the interior of the computer system can be arranged such that the direction of air flowing through and out of the active heat sink of the present invention can be managed so that the heated air is not directed to components whose operation will be adversely affected by being exposed to the flow of heated air.

Another technical advantage of the active heat sink disclosed herein is the placement of the fan in an intermediate transverse position relative to the fins of the heat sink permits. In this configuration air swirl or turbulence is induced at the exit point of the first or inlet set of fins and additional swirl or turbulence is created at the entrance point of the second or outlet set of fins. Turbulence prevents the formation of a boundary layer between closely spaced fins. The formation of a boundary layer between adjacent fins will tend to limit the heat dissipating ability of the heat sink. Other technical advantages will be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
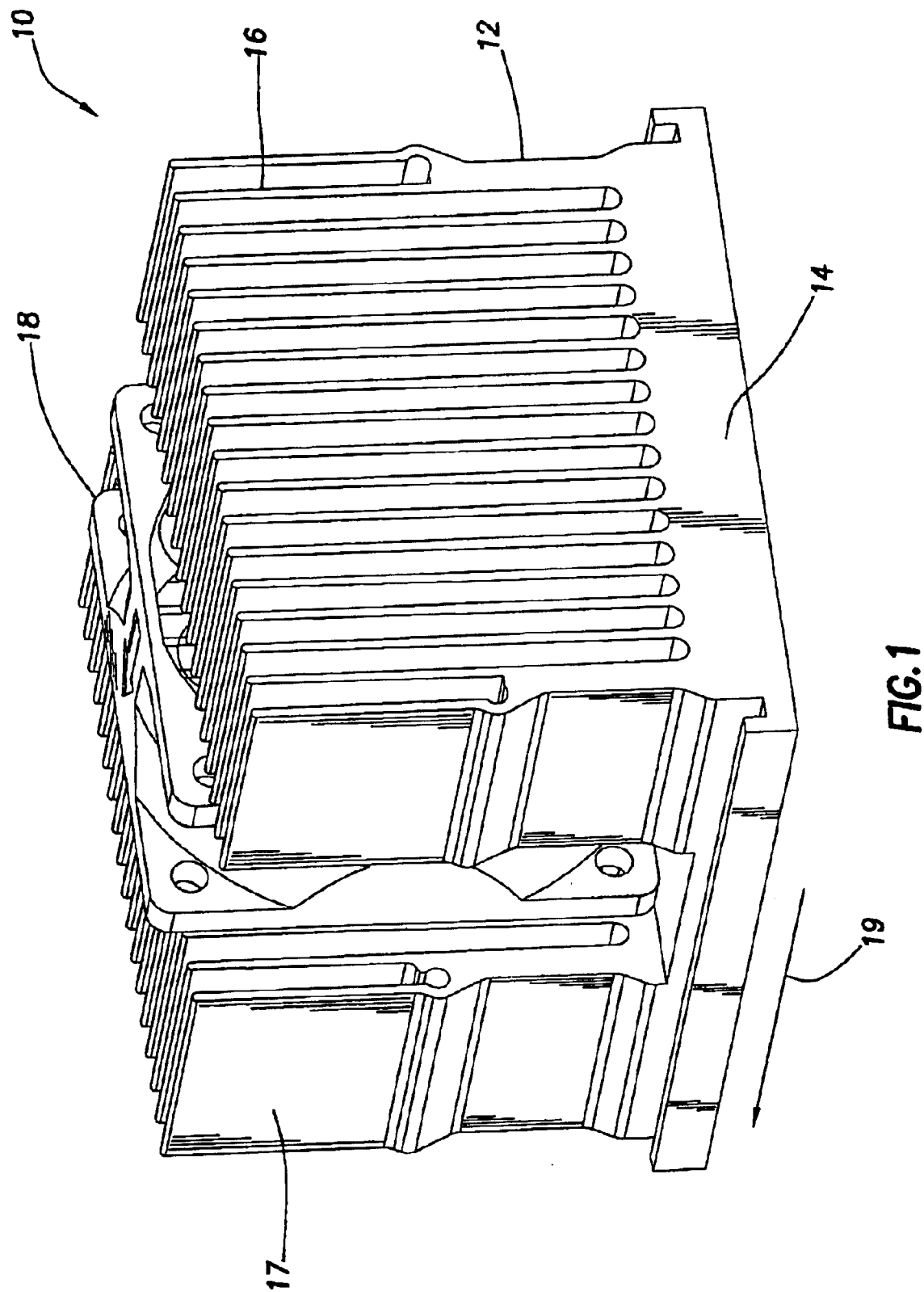
FIG. 1 is a pictorial view of an active heat sink.
Figure 2:
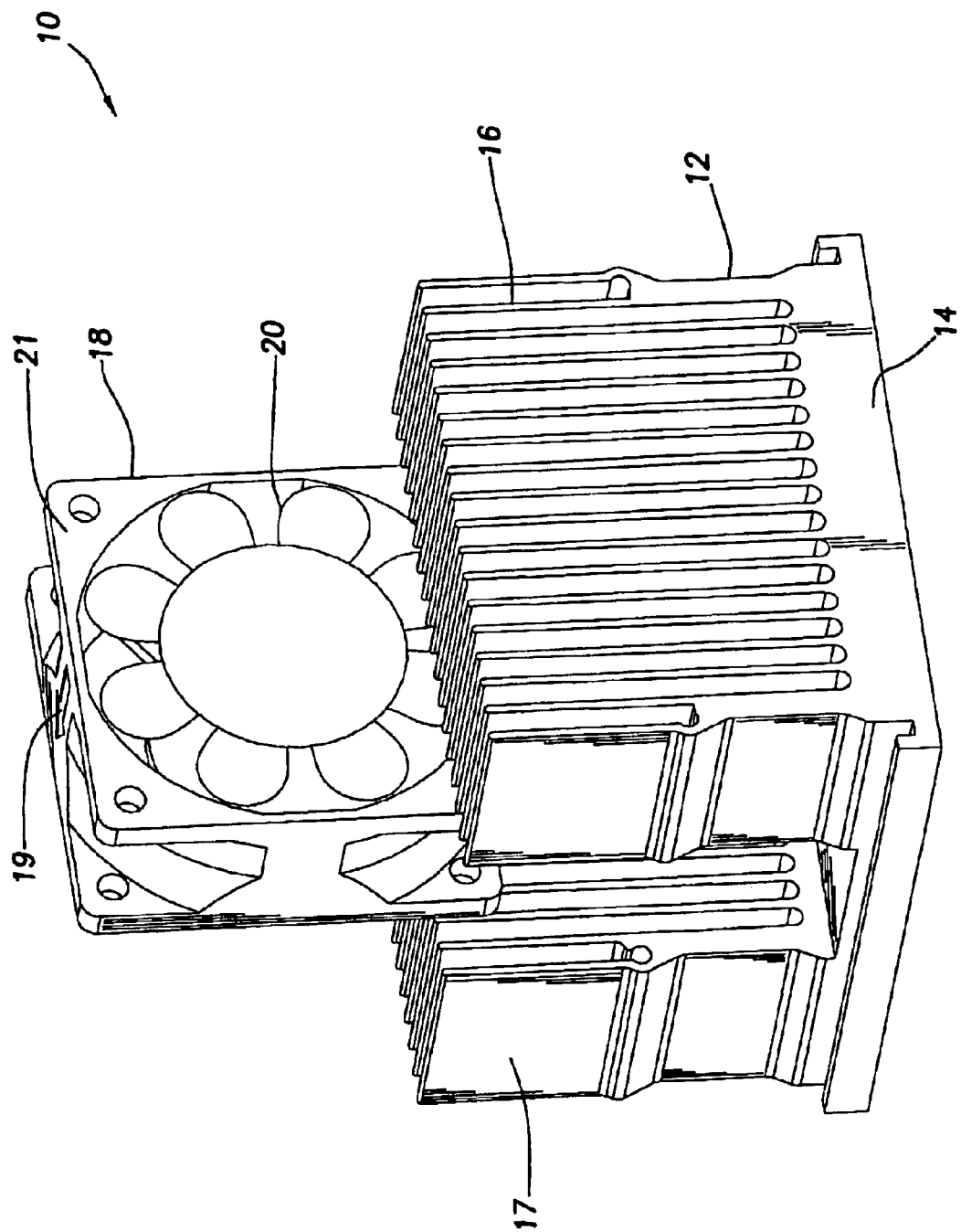
FIG. 2 is an exploded pictorial view of the active heat sink of FIG. 1.

Shown in FIG. 1 is an active heat sink, which is indicated generally at 10. Active heat sink 10 includes a heat sink 12 and a fan element 18. Heat sink 12 includes a base 14 and a first set 16 and a second set 17 of fins. Each of the fins of the heat sink extend in an upward direction from base 14. The fins are positioned in a transverse or longitudinal direction relative to the direction of air flow through fan 18. Fan 18 generally directs air across the length of the fins. The direction of air flow is shown by arrow 19. Shown in FIG. 2 is a partially exploded view of active heat sink 10 with fan 18 shown as being disengaged from heat sink 12. In this view, fan element 18 is shown and includes a frame 21 and blades 20. Blades 20 spin around a longitudinal axis in fan element 18 to direct air in the direction of arrow 19. This direction is defined as the transverse direction. Air is forced through the fan blades and across the fins in a direction that is across the length of the fins. From the perspective of the direction of air flow 19, first set of fins 16 can be defined as an inlet set of fins, and second set of fins 17 can be defined as an outlet set of fins. The base and the fins of the heat sink are commonly formed of a metal material, but could be of any other suitable material, including plastic.

FIG. 2 includes an exploded view of fan element 18. As shown in FIG. 2, fan element 18 does not include a guard. A fan guard is not necessary, as the blades of the fan are shielded in the transverse directions by the first and second set of fins 16 and 17. As such, as shown in FIG. 1, a user cannot reach the blades 20 of fan element 18 when the fan is in operation. Because a fan guard is not placed between the fins and the blades of the fan, the flow of air between the fins of the heat sink and the blades of the fan is not impeded by the presence of structure, such as a fan guard, that at least partially occludes the transverse air flow path through the rotating fan blades.

In operation, active heat sink 10 may be placed on the top surface of the microprocessor package, with only a layer of thermal jelly separating the active heat sink and the microprocessor package. Fan 18 can operate such that fan 18 is always on when power is applied to the computer system. As an alternative, fan 18 can be switched on or off or operated at varying speeds in response to the measured temperature of the microprocessor or interior of the computer system. When fan 18 is on, air is pulled into the heat sink through the first or inlet set of fins 16 in the direction of arrow 19, and air is forced out of the active heat sink through the second or outlet set of fins 17. Fan 18 creates air turbulence in the area that is the exit point of the inlet set of fins 16 and the area that is the entrance point for the outlet set of fins 17. Creating turbulent flow in these locations in the active heat sink prevents the formation of boundary layers in the space between adjacent fins in a way that limits the ability of the active heat sink to dissipate heat.

Figure 3:
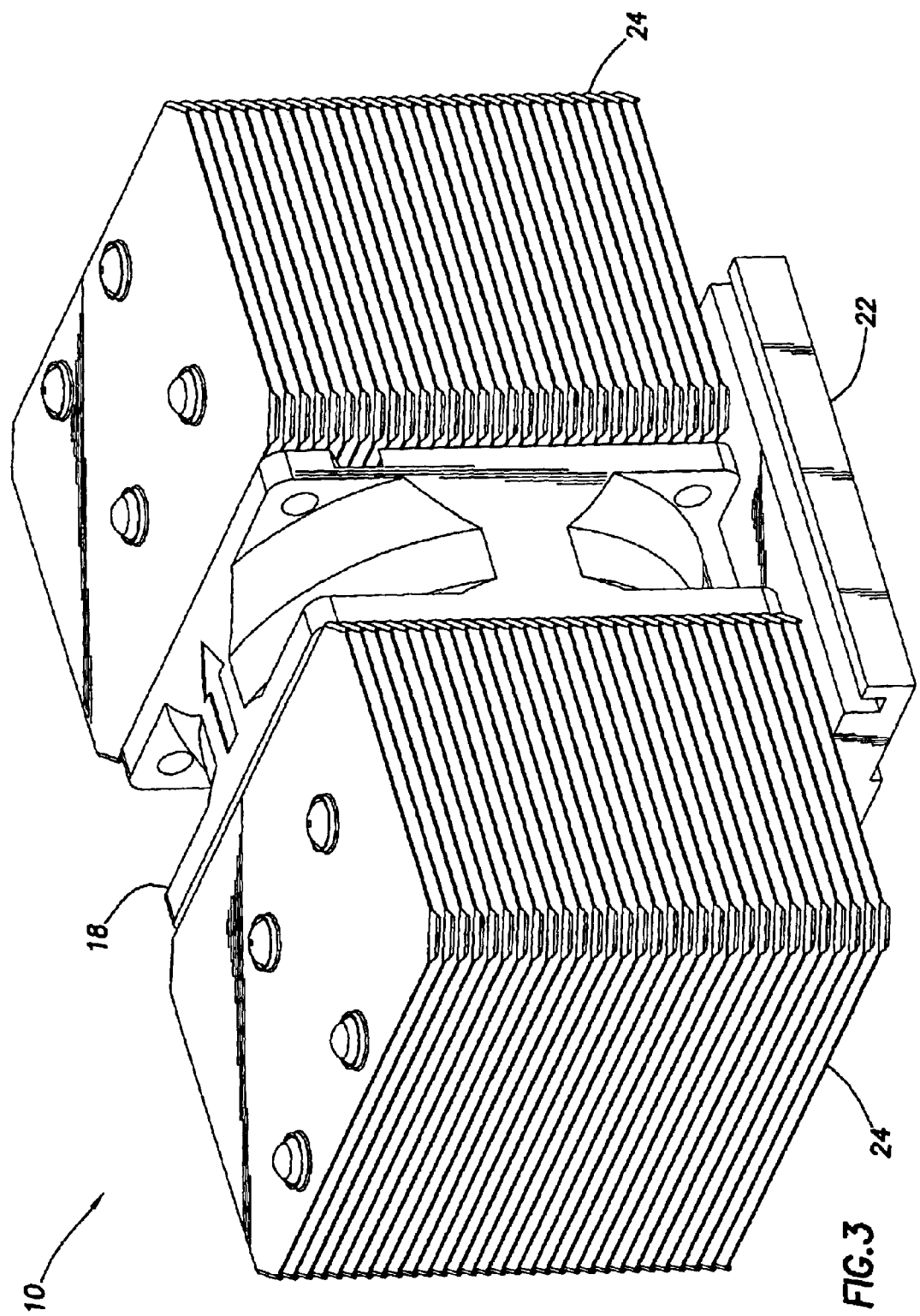
FIG. 3 is a pictorial view of an embodiment of an active heat sink.

Shown in FIG. 3 is another example of an active heat sink, which is indicated generally at 10. The active heat sink 10 of FIG. 3 includes first and second sets of fins 24 and a fan 18 that is positioned between the sets of fins. The lower portion of active heat sink 10 is placed on a microprocessor package 22. Unlike the heat sink of FIGS. 1 and 2, the surfaces of the fins of active heat sink of FIG. 3 are parallel to the top surface of the associated microprocessor package. In the heat sink of FIGS. 1 and 2, the surfaces of the fins of the active heat sink are positioned in a radial or perpendicular relationship to the surface of the associated microprocessor package.

The active heat sinks described herein are not limited to use with microprocessors, or in information handling systems or computer systems. Rather, the active heat sink described herein can be used in any application in which it is necessary to remove heat from an element of the system. Although the present disclosure has been described in detail, it should be understood that various changes, substitutions, and alterations can be made hereto without departing from the spirit and the scope of the invention as defined by the appended claims.

What is claimed is:

1. An active heat sink, comprising:
   a base;
   a first set of fins extending from the base, wherein the surfaces of the first set of fins are perpendicular to the base;
   a second set of fins extending from the base, wherein the surfaces of the first set of fins are perpendicular to the base;
   a fan positioned between the first and second set of fins such that the placement of the fan between the first and second set of fins prevents access to the blades of the fan, and wherein, when the fan is operational, air is forced across the length of the fins in a transverse direction.

2. The active heat sink of claim 1, wherein the base and fins of the heat sink are made of a metal.

3. The active heat sink of claim 1, wherein a separate fan guard element is not positioned between the blades of the fan and fins of the active heat sink.

4. An information handling system, comprising:
   a processor;
   memory, wherein the processor is operable to retrieve instructions from the memory;
   an active heat sink, wherein the active heat sink dissipates heat generated by the processor and includes,
      a first set of fins extending from the base, wherein the surfaces of the first set of fins are perpendicular to the base;
      a second set of fins extending from the base, wherein the surfaces of the second set of fins are perpendicular to the base; and
      a fan positioned between the first and second set of fins such that the placement of the fan between the first and second set of fine prevents access to the blades of the fan, and wherein, when the fan is operational, air is forced across the length of the fins in a transverse direction.

5. The information handling system of claim 4, wherein the base and the fins of the heat sink are made of a metal.

6. The information handling system of claim 4, wherein a separate fan guard element is not positioned between the blades of the fan and fins of the active heat sink.

7. A computer system, comprising:
   a processor;
   a memory, wherein the processor is able to retrieve instructions from memory,
   an active heat sink, wherein the active heat sink dissipates heat generated by the processor and includes,
      a first set of fins extending from the base, wherein the surfaces of the first set of fins are perpendicular to the base;
      a second set of fins extending from the base, wherein the surfaces of the second set of fins are perpendicular to the base; and a fan positioned between the first and second set of fins such that the placement of the fan between the first and second set of fins prevents access to the blades of the fan, and wherein, when the fan is operational, air is forced across the length of the fins in a transverse direction.

8. The computer system of claim 7, wherein the fins of the active heat sink are made of a metal.

9. The computer system of claim 7, wherein the fins of the active heat sink extend from a base of the active heat sink.

10. The computer system of claim 7,
wherein the fins of the active heat sink are made of a metal; and
wherein the fins of the active heat sink extend from a base of the active heat sink.

11. The computer system of claim 7, wherein a separate fan guard element is not positioned between the blades of the fan and fins of the active heat sink.

* * * * *